United States Patent
Chiang et al.

(10) Patent No.: US 7,589,393 B2
(45) Date of Patent: Sep. 15, 2009

(54) SEMICONDUCTOR STRUCTURE OF A HIGH SIDE DRIVER FOR TWO HIGH VOLTAGE NODES WITH PARTIALLY LINKED DEEP WELLS AND METHOD FOR MANUFACTURING THE SAME

(75) Inventors: Chiu-Chih Chiang, Hsinchu (TW); Chih-Feng Huang, Jhubei (TW)

(73) Assignee: System General Corporation, Taipei (TW)

( * ) Notice: Subject to any disclaimer, the term of this patent is extended or adjusted under 35 U.S.C. 154(b) by 246 days.

(21) Appl. No.: 11/492,039

(22) Filed: Jul. 25, 2006

(65) Prior Publication Data

US 2008/0023786 A1   Jan. 31, 2008

(51) Int. Cl.
*H01L 29/06* (2006.01)

(52) U.S. Cl. .................. 257/532; 257/496; 257/487; 257/654; 257/653; 257/E27.01; 257/E27.034

(58) Field of Classification Search .......... 257/500, 257/532, 536, 653, 654, 487, 496, E27.01, 257/E27.034
See application file for complete search history.

(56) References Cited

U.S. PATENT DOCUMENTS 5,258,636 A   11/1993  Rumennik et al.
5,736,774 A   4/1998   Fujihira
5,801,418 A   9/1998   Ranjan
6,124,628 A   9/2000   Fujihira et al.
6,323,539 B1  11/2001  Fujihira et al.
7,205,201 B2* 4/2007   Huang et al. ................. 438/275
2003/0197588 A1* 10/2003 Chang et al. .................... 338/9
2006/0220170 A1* 10/2006 Huang et al. ................. 257/500
2007/0247225 A1* 10/2007 Huang et al. ................. 330/111
2007/0296058 A1* 12/2007 Chiang et al. ............... 257/532
2008/0017926 A1*  1/2008 Chiang et al. ............... 257/355
2008/0042241 A1*  2/2008 Chiang et al. ............... 257/536

* cited by examiner

*Primary Examiner*—Phat X Cao
*Assistant Examiner*—Diana C Garrity
(74) *Attorney, Agent, or Firm*—Bacon & Thomas PLLC

(57) ABSTRACT

A semiconductor structure of a high side driver includes an ion-doped junction. The ion-doped junction includes a substrate, a first deep well and a second deep well, a first heavy ion-doped region and a second heavy ion-doped region. The first deep well and second deep well are formed in the substrate, which are separated but partially linked with each other, and the first deep well and the second deep well have the same ion-doped type. The first heavy ion-doped region is formed in the first deep well for connecting to a first high voltage, and the first heavy ion-doped region has the same ion-doped type as the first deep well. The second heavy ion-doped region is formed in the second deep well for connecting to a second high voltage, and the second heavy ion-doped region has the same ion-doped type as the first deep well.

14 Claims, 6 Drawing Sheets

SEMICONDUCTOR STRUCTURE OF A HIGH SIDE DRIVER FOR TWO HIGH VOLTAGE NODES WITH PARTIALLY LINKED DEEP WELLS AND METHOD FOR MANUFACTURING THE SAME

BACKGROUND OF THE INVENTION

1. Field of the Invention

The invention relates in general to a semiconductor structure, and more particularly to a semiconductor structure of a high side driver and method for manufacturing the same.

2. Description of the Related Art

With respect to a high side driver having two high voltage nodes, when the two high voltage nodes are getting closer, the breakdown voltage of the p-n junction under the nodes may increase to enlarge the leakage current in the region between the two high voltage nodes above the p-n junction. The basic concept to separate two high voltage nodes for reducing the leakage current is to increase the distance between the two high voltage nodes. However, it will enlarge the die size and increase manufacturing cost.

SUMMARY OF THE INVENTION

It is therefore an object of the invention to provide a semiconductor structure of a high side driver. By forming two deep wells separated but partially linked in the region of the substrate under the two high voltage nodes, the resistance of the deep wells between the two high voltage nodes can be increased to reduce leakage current between the two high voltage nodes. Therefore, the die size and cost of the high side driver can be reduced.

The invention achieves the above-identified object by providing a semiconductor structure of a high side driver including an ion-doped junction. The ion-doped junction includes a substrate, a first deep well and a second deep well, a first heavy ion-doped region and a second heavy ion-doped region. The first deep well and second deep well are formed in the substrate, which are separated but partially linked with each other, and the first deep well and the second deep well have the same ion-doped type. The first heavy ion-doped region is formed in the first deep well for connecting to a first high voltage, and the first heavy ion-doped region has the same ion-doped type as the first deep well. The second heavy ion-doped region is formed in the second deep well for connecting to a second high voltage, and the second heavy ion-doped region has the same ion-doped type as the first deep well.

The invention achieves the above-identified object by providing a method for manufacturing a semiconductor structure of a high side driver. The method includes forming a substrate; forming a first deep well and a second deep well in the substrate, wherein the first deep well and the second deep well have the same ion-doped type and are separated but partially linked with each other; and forming a first heavy ion-doped region for connecting to a first high voltage and a second heavy ion-doped region for connecting to a second high voltage respectively in the first deep well and the second deep well, wherein the first heavy ion-doped region and the second heavy ion-doped region have the same ion-doped type as the first deep well.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
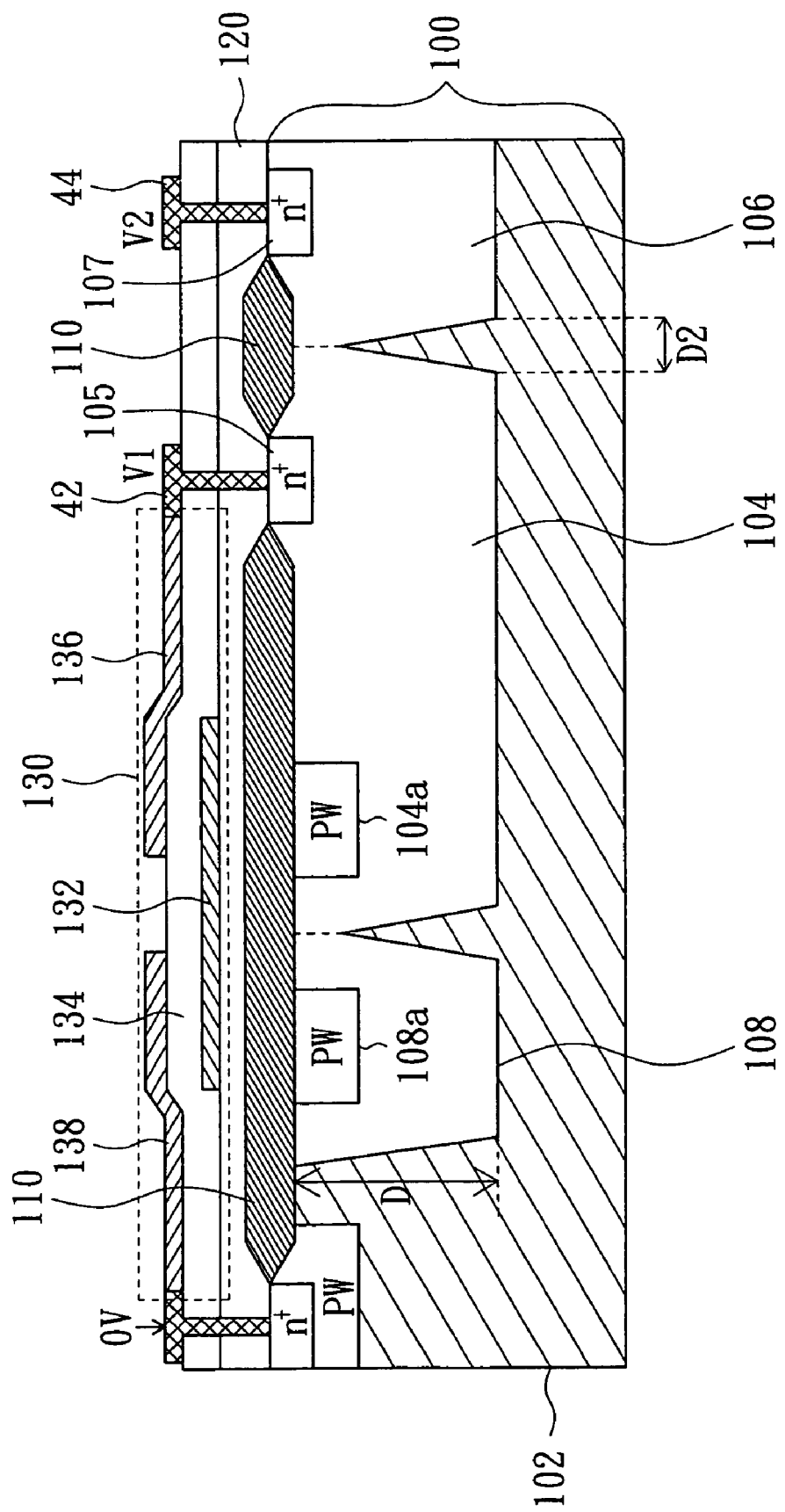
FIG. 1A is a partial cross-sectional diagram of a semiconductor structure of a high side driver in a power supply IC according to a preferred embodiment of the invention.

Referring to FIG. 1A, a partial cross-sectional diagram of a semiconductor structure of a high side driver in a power supply IC according to a preferred embodiment of the invention is shown. The semiconductor structure of a high side driver includes an ion-doped junction 100, an oxide layer 110, a first dielectric layer 120 and a conductive capacitor structure 130. The ion-doped junction 100 includes a substrate 102, a first deep well 104, a second deep well 106, a first heavy ion-doped region 105 and a second heavy ion-doped region 107. The first deep well 104 and the second deep well 106 are formed in the substrate 102 and separated but partially linked with each other at an area near the surface of the ion-doped junction 100, wherein the first deep well 104 and the second deep well 106 have the same ion-doped type.

The first heavy ion-doped region 105 is formed in the first deep well 104 for connecting to a first high voltage V1, such as 500V, wherein the first heavy ion-doped region 105 has the same ion-doped type as the first deep well 104. The second heavy ion-doped region 107 is formed in the second deep well 106 for connecting to a second high voltage V2, such as 530V, wherein the second heavy ion-doped region 107 has the same ion-doped type as the first deep well 104.

For example, the ion-doped junction 100 is a p-n junction, the substrate 102 is a P-substrate, and the first deep well 104 and the second deep well 106 are deep N-wells formed in the P-substrate. The first heavy ion-doped region 105 and the second ion-doped region 107 are n+ diffusion regions.

The ion-doped junction 100 further includes a third deep well 108 in the substrate 102 having the same ion-doped type as the first deep well 104 and partially linked with the first deep well 104 under the conductive capacitor structure 130. The third deep well 108 is also a deep N-well for instance. Besides, the first deep well 104 includes a first well 104a and the third deep well 108 includes a second well 108a, wherein the first well 104a and the second well 108a have a complementary ion-doped type to the first deep well 104. For example, the first well 104a and the second well 108a are P-wells (PW) or P-body. The breakdown voltage of the ion-doped junction 100 is determined by the shape and relative position of the first well 104a in the first deep well 104 and the second well 108a in the third deep well 108.

Preferably, the distance D2 between the first deep well 104 and the second deep well 106 is larger than 0 um and smaller than 20 um. The depth D of the first deep well 104, the second deep well 106 and the third deep well 108 is from 2 um to 10 um. The doping concentration of the first, deep well 104 and the second deep well 106 is from $1.7E17$ $cm^{-3}$ to $8.3E18$ $cm^{-3}$. The doping concentration of the first well 104a and the second well 108a is from $3.3E17$ $cm^{-3}$ to $1E19$ $cm^{-3}$.

In addition, the oxide layer 110 is formed on the ion-doped junction 110 with one part located between the two heavy ion-doped regions 105 and 107 and the other part located on the first deep well 104 and the third deep well 108. The first dielectric layer 120 is formed on the oxide layer 110 and the conductive capacitor structure 130 is formed on the first dielectric layer 120 and connected to the first high voltage V1. The conductive capacitor structure 130 includes a first metal layer 132, a second dielectric layer 134 and two separated second metal layers 136 and 138. The first metal layer 132 is formed on the first dielectric layer 120 and above the wells 104a and 108a, and the second dielectric layer 134 is formed on the first metal layer 132. The separated second metal layers 136 are formed on the second dielectric layer 134 and above the first metal layer 132, wherein one of the second metal layers 136 is connected to the first high voltage V1 and the other second metal layer 136 is connected to a low voltage, such as 0V.

The invention is not limited to having two second metal layers 136 and the conductive capacitor structure 130 can have more than two separated second metal layers 136 (i.e. more than two capacitors connected in series), wherein one of the second metal layers 136 is connected to the first high voltage V1 and another one of the second metal layers 136 is connected to the low voltage 0V.

Figure 1B:
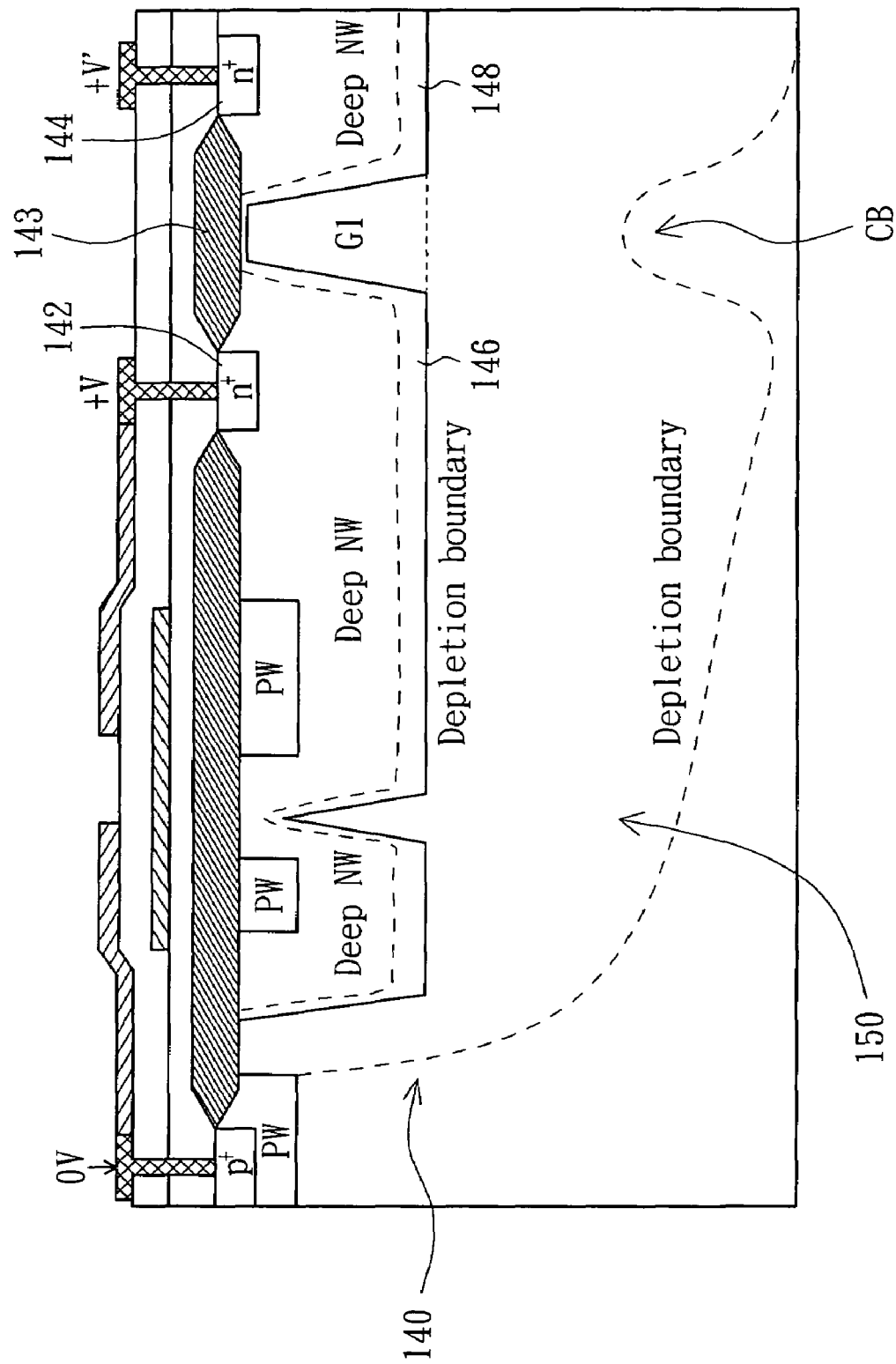
FIG. 1B shows the depletion region generated in the ion-doped junction of a conventional high side drive with two high voltage nodes.
Figure 1C:
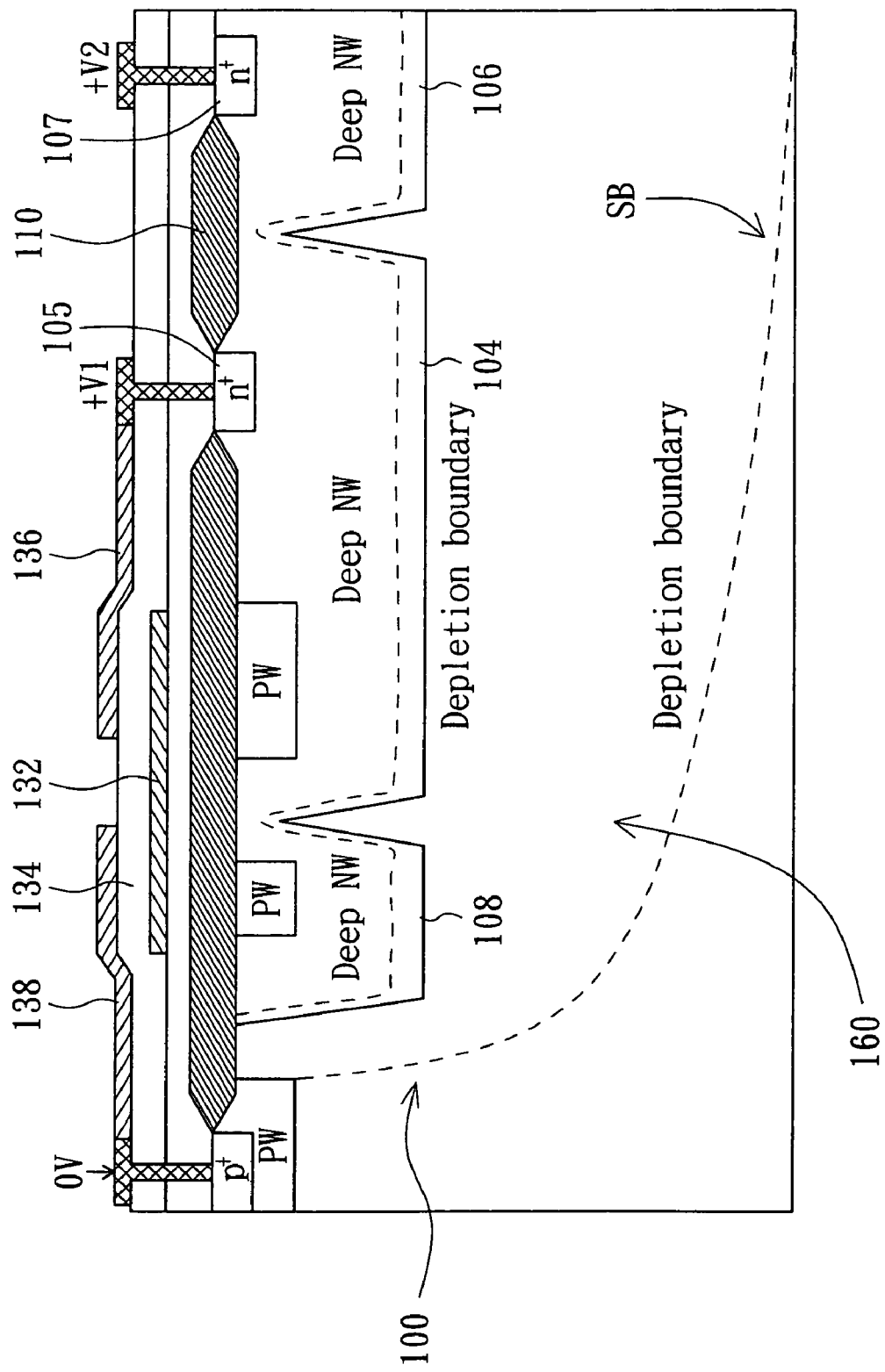
FIG. 1C shows the depletion region generated in the ion-doped junction of a high side drive with two high voltage nodes according to the preferred embodiment of the invention.

FIG. 1B shows the depletion region generated in the ion-doped junction of a conventional high side drive with two high voltage nodes. FIG. 1C shows the depletion region generated in the ion-doped junction of a high side drive with two high voltage nodes according to the preferred embodiment of the invention. As shown in FIG. 1B, in a conventional high side driver, the N+ regions 142 and 144 for connecting to the two high voltages V and V' are respectively formed in two deep N-wells 146 and 148. The depletion region 150 formed in the p-n junction 140 has a discontinuous boundary at the region G1 between the two deep N-wells 146 and 148 and a corresponding concave boundary CB in the substrate. Due to the concave boundary CB, the electric field of the depletion region 150 twists below the region G1 and causes an increasing local electrical field. Charge carriers are accelerated to collide with crystal lattices to generate even more carriers until an avalanche of the depletion region 150 is occurred, thereby degrading breakdown voltage of the p-n junction 140 and increasing the leakage current between the two N+ regions 142 and 144.

However, as shown in FIG. 1C, in the high side driver of the invention, the deep wells 104 and 106 are separated but partially linked in the region between the two heavy ion-doped regions 105 and 107. As a result, the depletion region 160 generated in the ion-doped junction 100 has a boundary at the partially-linked region of the deep wells 104 and 106 and a corresponding smooth boundary SB in the substrate 102, which is not like the depletion region 150 in FIG. 1B. In this case, the electric field of the depletion region 160 is not twisted and thus the breakdown voltage of the ion-doped junction 100 is not decreased and the leakage current generated between the two high voltage nodes (V1 and V2) can be greatly reduced.

Figure 2:
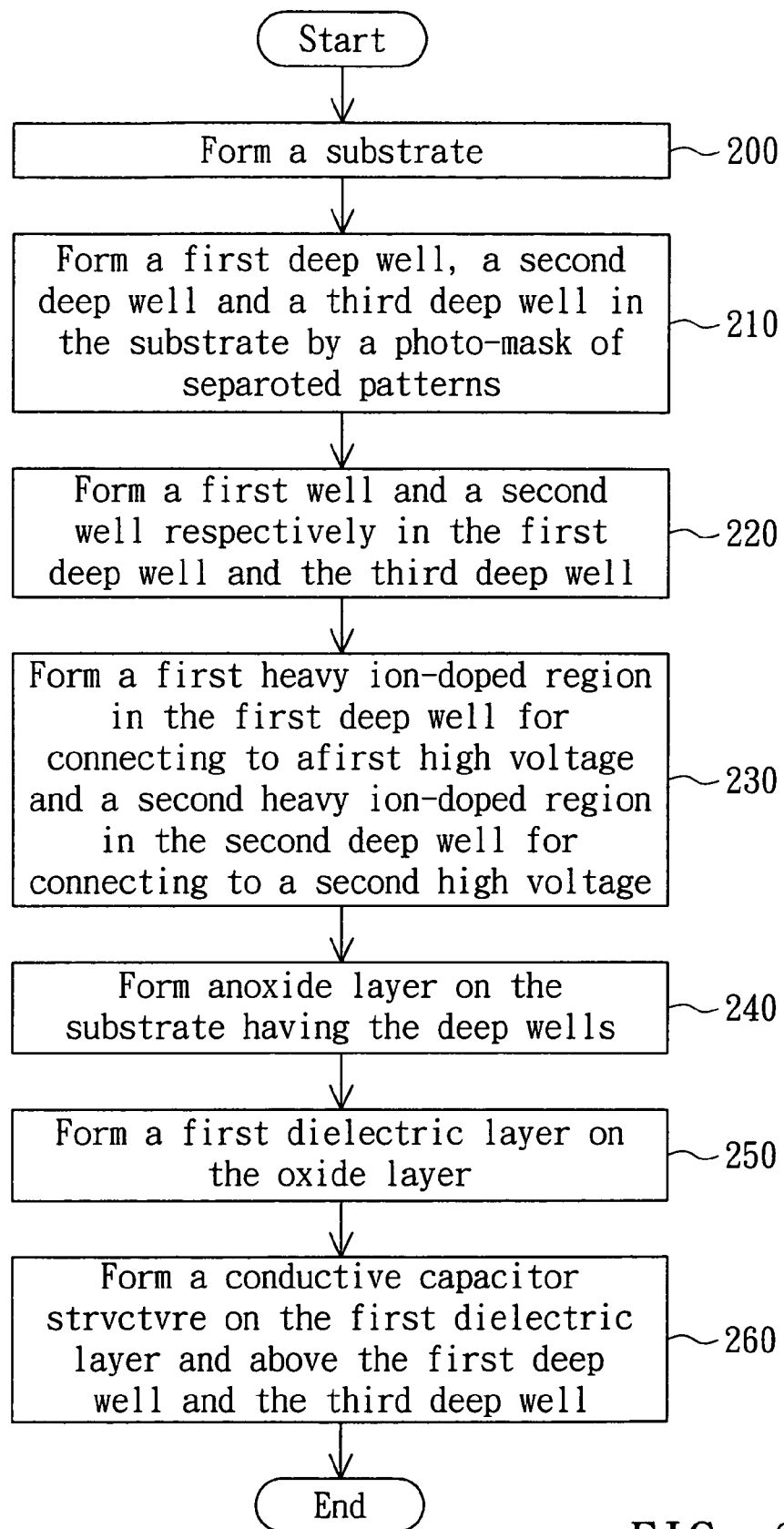
FIG. 2 is a flow chart of the method for manufacturing the semiconductor structure of a high side driver in FIG. 1A.
Figure 3:
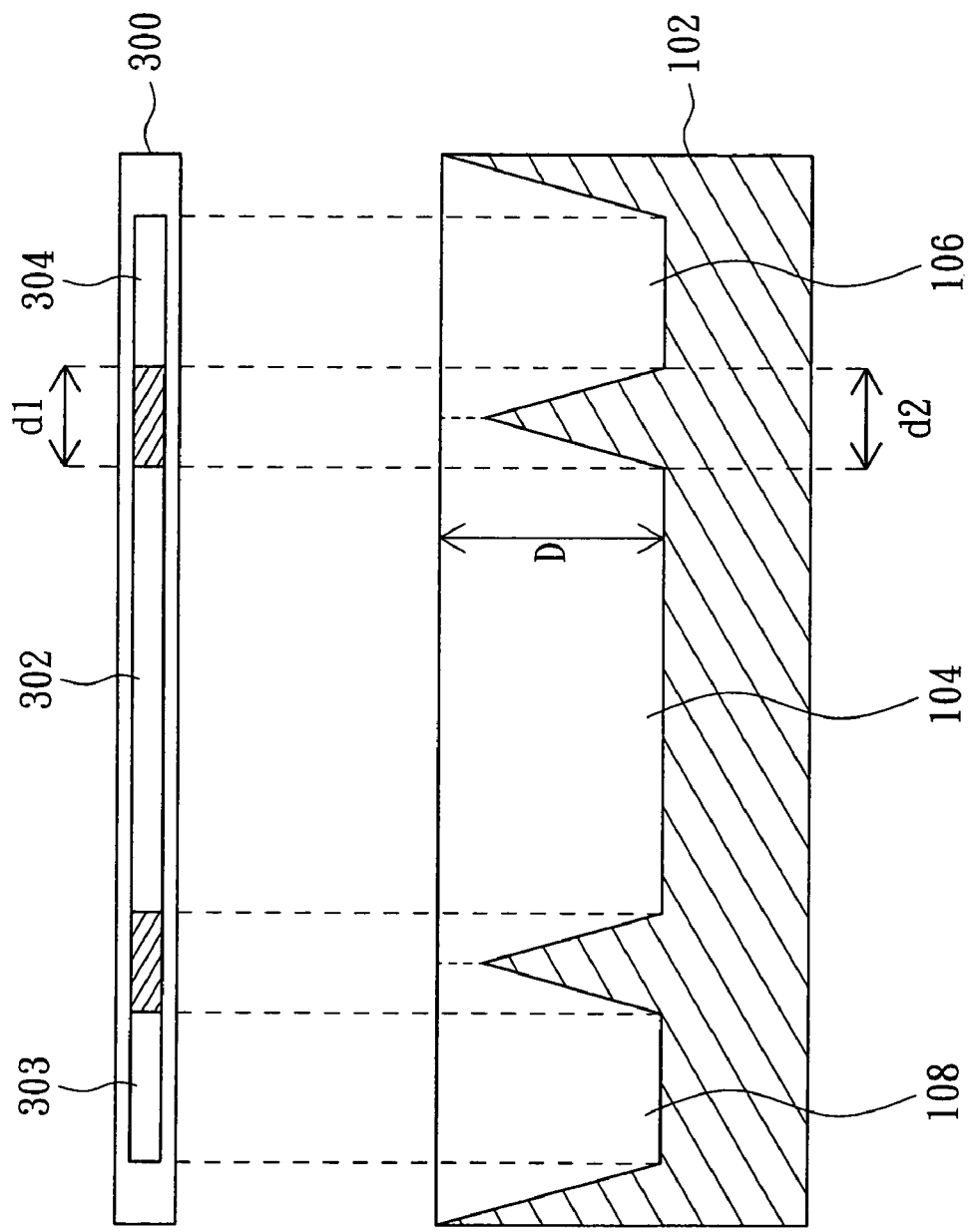
FIG. 3 is a schematic diagram of an ion doping process for forming the partially linked ion-doped deep wells in FIG. 1A by using a photo-mask with separated patterns.

Referring to FIG. 2, a flow chart of the method for manufacturing the semiconductor structure of a high side driver in FIG. 1A is shown. Firstly, in step 200, form the substrate 102, such as a P-substrate. Then, in step 210, form the first deep well 104, the second deep well 106 and the third deep well 108 (such as deep N-wells) which are separated but partially linked with each other in the substrate 102 by a photo-mask 300 with separated patterns 302~304 as shown in FIG. 3 in a thermal drive-in process during a temperature from 1000° C. to 1200° C. for 6~12 hours. The distance d1 of the separated patterns 302 and 304 is proportional to the distance d2 between the first deep well 104 and the second deep well 106 and determines the leakage current between the first heavy ion-doped region 105 and the second heavy ion-doped region 107 (not shown in the figure). Preferably, the distance d2 between the first deep well 104 and the second deep well 106 is larger than 0 um and smaller than 20 um, and the depth D of the first deep well 104, the second deep well 106 and the third deep well 108 is from 2 um to 10 um. Besides, the doping concentration of the first deep well 104, the second deep well 106 and the third deep well 108 is from 1.7E17 cm−3 to 8.3E18 cm−3.

Following that, in step 220, form the first well 104a and the second well 108a, such as P-wells respectively in the first deep well 104 and the third deep well 108 in a thermal drive-in process during a temperature 900° C. to 1100° C. for 2~6 hours. The doping concentration of the first well 104a and the second well 108a is from 3.3E17 cm−3 to 1E19 cm−3, preferably.

Afterward, in step 230, form the first heavy ion-doped region 105 (such as an n+ region) in the first deep well 104 for connecting to the first high voltage V1 and the second heavy ion-doped region 107 (such as an n+ region) in the second deep well 106 for connecting to the second high voltage V2.

In step 240, form the oxide layer 110 on the substrate 102 having the deep wells 104, 106 and 108, wherein the oxide layer 110 has one part located between the two heavy ion-doped regions 105 and 107 and the other part located on the deep wells 104 and 108. In step 250, from the first dielectric layer 120 on the oxide layer 110. Finally, in step 260, form the conductive capacitor structure 130 on the first dielectric layer 120 and above the first deep well 104 and the second deep well 108 by forming the first metal layer 132 on the first dielectric layer 120 and above the wells 104a and 108a, the second dielectric layer 134 on the first metal layer 132, and the two separated second metal layers 136 and 138 on the second dielectric layer 134, wherein the second metal layers 136 and 138 are respectively connected to the first voltage V1 and the low voltage 0V.

Figure 4:
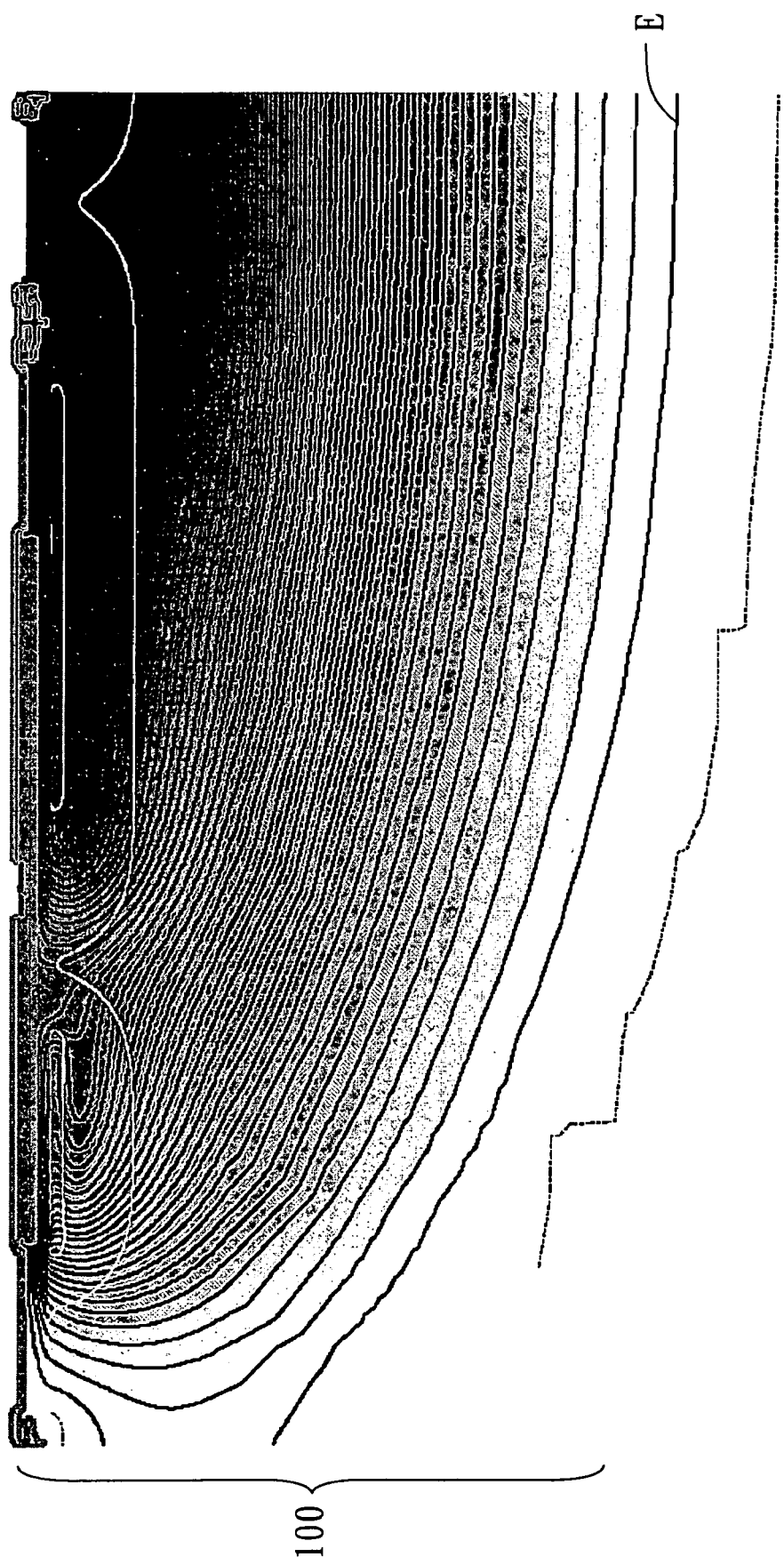
FIG. 4 is a simulation potential profile of the semiconductor structure of a high side driver according to the preferred embodiment of the invention.

Referring to FIG. 4, a simulation potential profile of the semiconductor structure of a high side driver according to the preferred embodiment of the invention is shown. From FIG. 4, it can be clearly seen that the electric field E inside the ion-doped junction 100 is very uniform, which demonstrates that a good performance of the high side driver with two high voltage nodes can still be achieved by using the ion-doped junction 100 with the partially separated ion-doped deep wells (not shown in the figure).

In the semiconductor structure of a high side driver and method for manufacturing the same disclosed by the above-mentioned embodiment, by forming deep wells separated but partially linked in the region of the substrate between the two heavy ion-doped regions for connecting to two high voltage nodes, the resistance of the deep wells between the two high voltage nodes can be increased to reduce leakage current between the two high voltage nodes without worsening the breakdown voltage of the HV junction. Therefore, the die size and cost of the high side driver can be effectively reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure of a high side driver, comprising:
    an ion-doped junction, comprising:
        a substrate;
        a first deep well and a second deep well, formed in the substrate, wherein the first deep well and the second deep well are separated but partially linked with each other and have the same ion-doped type, and a depletion region formed in the ion-doped junction having a continuous boundary at a partially-linked region of the first deep well and the second deep well;
        a first heavy ion-doped region, formed in the first deep well for connecting to a first high voltage, wherein the first heavy ion-doped region has the same ion-doped type as the first deep well; and
        a second heavy ion-doped region, formed in the second deep well for connecting to a second high voltage, wherein the second heavy ion-doped region has the same ion-doped type as the first deep well.

2. The semiconductor structure according to claim 1, wherein the distance between the first deep well and the second deep well is larger than 0 um and smaller than 20 um.

3. The semiconductor structure according to claim 1, further comprising:
    an oxide layer, formed on the ion-doped junction; and
    a conductive capacitor structure, formed on the oxide layer and connected to the first high voltage.

4. The semiconductor structure according to claim 3, wherein the ion-doped junction further comprises a third deep well having the same ion-doped type as the first deep well and partially linked with the first deep well under the conductive capacitor structure.

5. The semiconductor structure according to claim 4, wherein the ion-doped junction further comprises a first well in the first deep well and a second well in the third deep well and the first well and the second well have a complementary ion-doped type to the first deep well.

6. The semiconductor structure according to claim 5, wherein the breakdown voltage of the ion-doped junction is determined by the shape and relative position of the first well in the first deep well and the second well in the third deep well.

7. The semiconductor structure according to claim 5, wherein the doping concentration of the first well and the second well is from $3.3 \times 10^{17}$ cm$^{-3}$ to $10^{19}$ cm$^{-3}$.

8. The semiconductor structure according to claim 4, wherein the depth of the first deep well, the second deep well and the third deep well is from 2 um to 10 um.

9. The semiconductor structure according to claim 3, further comprising a first dielectric layer formed between the conductive capacitor structure and the oxide layer.

10. The semiconductor structure according to claim 9, wherein the conductive capacitor structure comprising:
    a first metal layer, formed on the first dielectric layer;
    a second dielectric layer, formed on the first metal layer; and
    a plurality of separated second metal layers, formed on the second dielectric layer, wherein one of the second metal layers is connected to the first high voltage and another one of the second metal layers is connected to a low voltage.

11. The semiconductor structure according to claim 1, wherein the substrate is a P-substrate and the first deep well and the second deep well are deep N-wells formed in the P-substrate.

12. The semiconductor structure according to claim 1, wherein the doping concentration of the first deep well and the second deep well is from $1.7 \times 10^{17}$ cm$^{-3}$ to $8.3 \times 10^{18}$ cm$^{-3}$.

13. The semiconductor structure according to claim 1, wherein the first deep well and the second deep well are partially linked to each other at an area near a surface of the ion-doped junction.

14. The semiconductor structure according to claim 1, wherein the difference between the first high voltage and the second high voltage is about 30V.

* * * * *

UNITED STATES PATENT AND TRADEMARK OFFICE
CERTIFICATE OF CORRECTION

PATENT NO.       : 7,589,393 B2                                    Page 1 of 1
APPLICATION NO.  : 11/492039
DATED            : September 15, 2009
INVENTOR(S)      : Chiang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 298 days.

Signed and Sealed this

Twenty-first Day of September, 2010

David J. Kappos
*Director of the United States Patent and Trademark Office*